(12) United States Patent
Gresham et al.

(10) Patent No.: US 6,329,702 B1
(45) Date of Patent: Dec. 11, 2001

(54) HIGH FREQUENCY CARRIER

(75) Inventors: Robert Ian Gresham, Somerville;
Ryosuke Ito, Amherst, both of MA (US)

(73) Assignee: Tyco Electronics Corporation, Wilmington, DE (US)

( * ) Notice: Subject to any disclaimer, the term of this patent is extended or adjusted under 35 U.S.C. 154(b) by 0 days.

(21) Appl. No.: 09/611,057

(22) Filed: Jul. 6, 2000

(51) Int. Cl.[7] ................................................... H01L 29/06
(52) U.S. Cl. ............................................ 257/623; 257/624
(58) Field of Search ..................................... 257/594, 623, 257/666, 624, 626

(56) References Cited

U.S. PATENT DOCUMENTS

| | | | |
|---|---|---|---|
| 4,023,260 | * 5/1977 | Schneider et al. | 257/624 |
| 4,210,923 | 7/1980 | North et al. | 257/432 |
| 5,343,070 | * 8/1994 | Goodrich et al. | 257/624 |
| 5,355,283 | 10/1994 | Marrs et al. | 361/760 |
| 5,694,300 | 12/1997 | Mattei | 361/818 |
| 5,696,466 | 12/1997 | Li | 330/286 |
| 5,717,245 | 2/1998 | Pedder | 257/691 |

* cited by examiner

*Primary Examiner*—Roy Potter

(57) ABSTRACT

A high frequency carrier is provided which comprises: (a) a planar ceramic substrate having first and second faces and (b) at least one feed-through extending from the first face to the second face. The at least one feed-through comprises a pedestal of doped semiconductor that is at least partially surrounded by a conductive metal layer. Also described is an electrical assembly, which comprises the above high frequency carrier and a metallized substrate. The first face of the carrier is attached to the metallized substrate such that the at least one feed-through is electrically connected to the metallized substrate. The electrical assembly can also comprise at least one electronic element (such as an electronic component or an electronic circuit) that is attached to the second face of the carrier such that the at least one electronic element is electrically connected to at least one feed-through.

31 Claims, 2 Drawing Sheets

HIGH FREQUENCY CARRIER

FIELD OF THE INVENTION

The present invention relates to an interconnect structure having signal feed-throughs that are effective at microwave and millimeter wave frequencies.

BACKGROUND OF THE INVENTION

There is growing demand for very compact, low-cost, high frequency (i.e., microwave or millimeter wave) communications circuits.

In response to this demand, such circuits frequently employ mixed-technology silicon integrated circuit (IC) and gallium arsenide (GaAs) monolithic microwave integrated circuit devices (MMICs) supported on multi-chip module (MCM) substrate structures. The IC and MMICs usually consist of active devices and integrated passive components.

Since these products operate at high frequencies continuity of the RF ground plane is required for the MCM substrate and its mounted microwave GaAs and high-speed silicon active devices. Moreover, the efficiency of the interconnects in transmitting the signal power is required to be high to achieve a very low insertion loss and return loss To address these requirements, a ball grid array structure (BGA) has been proposed, which allows feed-throughs at microwave and millimeter wave frequencies from electrical components, integrated circuits or MCM substrates to other circuitry such as circuit boards. See, e.g., U.S. Pat. No. 5,694,300 to Mattei et al., U.S. Pat. No. 5,717,245 to Pedder et al. and U.S. Pat. No. 5,355,283 to Marrs et al.

Ball grid arrays, however, conventionally utilize metal interconnects which are limited in their high frequency performance due to parasitic inductance, capacitance and resistance effects.

SUMMARY OF THE INVENTION

The above and other deficiencies of the prior art are addressed by the carrier of the present invention, which comprises: (a) a planar ceramic substrate having first and second faces and (b) at least one feed-through extending from the first face to the second face. The at least one feed-through comprises a pedestal of doped semiconductor that is at least partially surrounded by a conductive metal layer.

Glass is a preferred ceramic substrate material, preferred semiconductor materials include silicon provided with sufficient doping (e.g., arsenic doping) to reduce its resistivity to 0.02 $\Omega$-cm or less, and a pyramidal section is a preferred form for the pedestal. The conductive metal is preferably selected from silver, gold and copper, and the pedestal may be completely surrounded by metal in some embodiments.

Typically, a metallization layer is also provided on at least one face of the planar ceramic substrate. One exemplary metallization layer comprises copper on nickel. The metallization layer can comprise one or more signal paths, for example, one or more radio frequency transmission lines such as microstrip lines or coplanar line structures.

In many preferred embodiments, one or more solder balls are provided on the metallization, on the feed-throughs, or on both the metallization and the feed-throughs.

According to another embodiment of the invention, an electrical assembly is provided, which comprises the above high frequency carrier and a metallized substrate. The first face of the carrier is attached to the metallized substrate and the at least one feed-through is electrically connected to the metallized substrate.

In many cases, it is also preferred to attach at least one electronic element (such as an electronic component or an electronic circuit) to the second face of the carrier, such that the at least one electronic element is electrically connected to at least one feed-through.

The electronic element can comprise, for example, an active device. Preferred active devices include electronic millimeter wave devices such as field-effect transistors, high electron mobility transistors and a heterojunction bipolar transistors.

According to one particular electrical assembly embodiment of, the metallized substrate is an MCM substrate, and the at least one electronic element comprises a semiconductor device.

Preferred metallized substrates for the electrical assembly include printed circuits (e.g., metallized substrates comprising epoxy and fiberglass) and metallized ceramic substrates. The metallization on the metallized substrate also frequently comprises one or more signal paths such as radio frequency transmission lines.

In constructing the electrical assembly, the metallized substrate can be attached to the first face of the high frequency carrier, and the at least one electronic element can be attached to the second face of the high frequency carrier, via one or more solder balls.

One advantage of the present invention is that the feed-throughs are manufactured using high-definition, well-established semiconductor processing technology, providing significant design flexibility. For example, very small feed-throughs can be provided. As a result, a carrier with a very high feed-through density can be realized. In addition, the small size of the feed-throughs within the carrier results in an advantageous reduction in the magnitude of parasitic impedance components. Moreover, control over the parasitic components is good and predictable.

A further advantage of the present invention is that the carrier can be used to provide a metallized substrate with passive circuitry, such as transmission lines. Alternatively, the carrier of the present invention can be used in connection with pre-existing techniques for mounting active components, such as flip-chip mounting, wire bond mounting, and so forth.

These and other advantages and embodiments of the present invention will become immediately apparent to those of ordinary skill in the art upon reading the description and claims to follow.

DETAILED DESCRIPTION

Figure 1A:
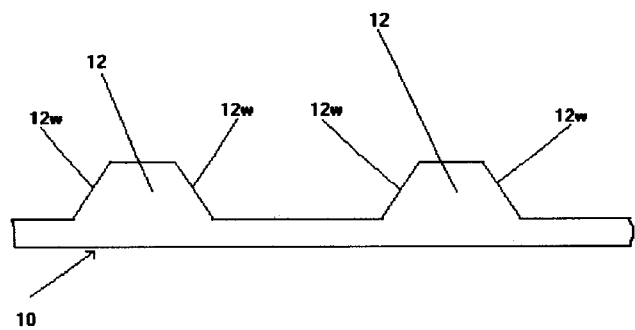
FIGS. 1A–1D illustrate a process for forming a carrier according to an embodiment of the present invention.

Several preferred embodiments of the present invention will now be described. This invention may, however, be embodied in different forms and should not be construed as limited to the embodiments set forth herein.

The present invention is directed to a carrier that comprises at least one feed-through extending through a planar substrate made of a ceramic material, such as glass or sapphire or other ceramic material. A glass substrate is preferred, more preferably a low-loss glass, such as borosilicate glass.

The feed-throughs comprise a doped semiconductor core that is at least partially enclosed by a layer of conductive material. The semiconductor can be an elemental semiconductor such as silicon or germanium or a compound semiconductor such as gallium arsenide. Silicon is preferred. Essentially any known dopant can be used for the practice of the invention. For example, typical dopants for silicon include boron, arsenic, phosphorous, and so forth. The doping level is preferably sufficient to reduce the resistivity of the semiconductor to 0.02 Ω-cm or less.

The feed-throughs can take any essentially any geometric form so long as a current path is provided between the faces of the substrate.

The dimension of the feed-through in a direction normal to the plane of the substrate will, of course, be the same as the thickness of the substrate itself. Within the plane of the substrate, a wide range of dimensions is possible. Typically, the in-plane cross-sectional area of the feed-through will depend upon the frequency of operation (with higher frequencies indicating smaller cross-sectional areas), the required "bump" (e.g., solder ball or other bump such as a polymer based bump) size, if any (with larger bumps indicating larger cross-sectional area), and so forth.

The feed-throughs are preferably in the form of pedestals having ends that are coplanar with the substrate faces. Preferred pedestal forms include columnar forms, partial conic sections and partial pyramidal sections. Where partial conic or pyramidal sections are used, the cross sectional area of the feed-through increases as one travels from the top side of the substrate to the bottom side. A partial pyramidal form is preferably employed, because such forms naturally arise from anisotropic etching during a preferred fabrication process that is discussed further below. Such forms are advantageous in that relatively large solder balls can be accommodated on one face of the carrier, while keeping the average cross-sectional area of the pedestal to a minimum.

The conductive material layer at least partially surrounding the semiconductor core is preferably a highly conductive metal such as silver, gold or copper. Typically, a metal layer covers the core where it emerges from the substrate at both faces, and a metal layer covers at least a portion of the core between the substrate faces. Adjusting the metal layer can enhance the high-frequency operation of the feed-through. Techniques for varying metal-coated structures in order to provide a tuned or resonant circuit at high frequencies are well known in the art. As an example, the thickness and/or pattern of the metallization on the semiconductor core between the faces of the substrate can be adjusted for this purpose.

If desired, metallization can be provided on one or both sides of the ceramic substrate. Such metallization is typically provided to form one or more signal paths such as DC and bias signal paths as well as radio frequency transmission lines. Examples of radio frequency transmission lines include microstrips and coplanar line structures. A microstrip contains as elements a strip metallization and a solid ground plane metallization separated by a dielectric layer. A coplanar line structure contains as elements a metallized strip with two coplanar reference lines, one on either side. Exemplary metallization schemes include Cu on Ni, Pt on Au, Au on Ti—W, and Ag on Cu.

The carrier of the present invention can be used to add passive components to a given metallized substrate. For example, high-resolution circuitry and/or one or more transmission lines can be provided on the ceramic substrate of the carrier.

The carrier of the present invention can also be used to electrically connect one or more electrical elements with a metallized substrate.

The one or more electrical elements may be, for example, electronic components and/or electronic circuits. These elements may comprise active devices, passive devices, or combinations thereof.

Preferred electrical components include silicon and gallium arsenide devices, including microwave and millimeter wave active devices. Specific microwave and millimeter wave active devices that may be present include, for example, field-effect transistors (FETs), high electron mobility transistors (HEMTs) and heterojunction bipolar transistor (HBTs).

Examples of electronic circuits include high frequency (i.e., microwave or millimeter wave) circuits such as oscillators mixers, switches, LNAs and so forth.

The metallized substrate can be for example, a metallized dielectric or semiconductor substrate. Examples of metallized substrates include MCM substrates and printed circuits, which can be rigid or flexible, depending upon the nature of the substrate. Common dielectric substrates include epoxy-fiberglass, ceramic-filled fluorocarbon polymers, polyimide, teflon substrates, teflon-ceramic composites, and so forth.

As a specific example, in one preferred embodiment of the invention, the metallized substrate is an MCM substrate, the electronic element is a GaAs or Si device, and the carrier is disposed between the MCM substrate and the GaAs or Si device.

The one or more electronic elements can be physically and electrically connected to metallization on one face of the carrier using known techniques. Similarly, metallization on the other face of the carrier can be physically and electrically connected to the metallized substrate, also using known techniques. Techniques are known for physically and electrically connecting complementary metallization schemes. These include solder bonding, for example, via solder balls (also commonly referred to as solder bumps), bonding using conductive polymers, and bonding using metal filled adhesives such as epoxies. Solder bonding using solder balls (e.g., of Pb—Sn or Au—Sn solder) between solder pads of solder-wettable metal (e.g., pads having a copper surface) is preferred.

The carrier of the present invention can be constructed using glass microwave integrated circuit (GMIC) techniques known in the art. A preferred process is discussed in connection with U.S. Pat. No. 5,696.466 to Li, the entire disclosure of which is hereby incorporated by reference. Referring now to FIGS. 1A through 1D, the process begins by providing a monocrystalline substrate of silicon doped with, for example, arsenic, to reduce the resistivity of the silicon, for example, to 0.003 ohm-cm or less. Silicon pedestals are defined using anisotropic etching techniques, producing sidewalls parallel to defined crystalline planes. Further details concerning etching of monocrystalline materials can be found in U.S. Pat. No. 4,210,923 to North et al, the disclosure of which is hereby incorporated by reference. Predictable and reproducible geometries are fabricated by this process, which can provide a substrate 10 with pedestals 12 having sidewalls 12w in well defined planes as shown in FIG. 1A. The height of the pedestal is preferably on the order of 125–250 microns.

Figure 1B:
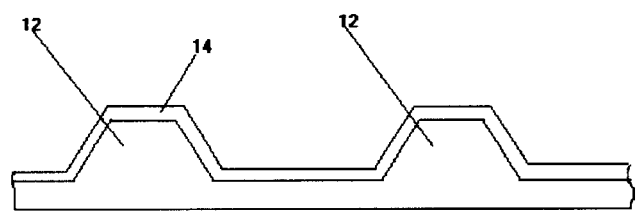

A layer of high conductivity metal 14 such as silver is deposited onto the substrate using techniques known in the art as shown in FIG. 1B. This metal layer can be patterned in a way to optimize the impedance of the final structure by masking and etching techniques known in the art.

Figure 1C:
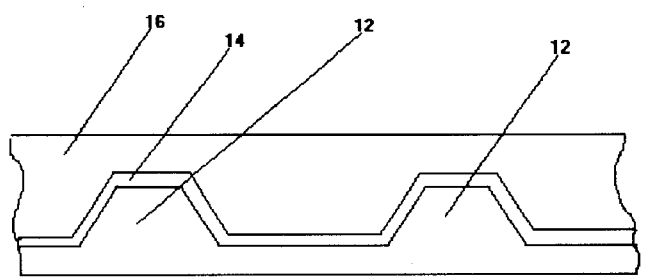

The trenches between the metal coated pedestals are then filled with a low loss glass such as Corning 7070, which is a borosilicate glass having a low dielectric constant and a low loss tangent, and which provides good electrical edge isolation and mechanical support. For example, the trenches can be filled with finely ground glass powder, which is subsequently heated to above the melting point. As another example, a glass wafer can be mounted onto the silicon wafer (after the pedestals have been defined) after which this assembly is heated to above the glass melting point. The glass and silicon wafers are then pressed together under high-pressure, filling the trenches between the pedestals. After the glassing step, the glass 16 is thicker than the depth of the silicon pedestals 12, preferably by at least 50 microns, as shown in FIG. 1C.

Figure 1D:
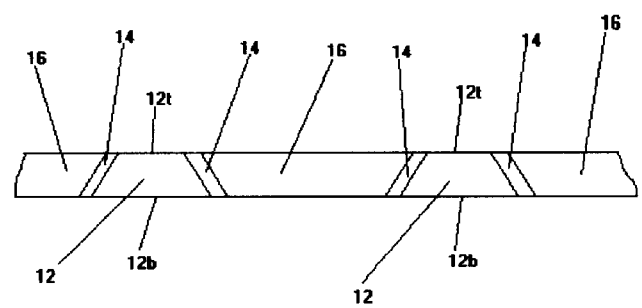

The wafer then undergoes a grinding process, followed by a standard polishing process, which is used to polish the wafer to expose the tops 12t and bottoms 12b of the silicon pedestals 12 as shown in FIG. 1D. The final pedestal height is preferably 115 to 260 microns. Because the glass is polished to the top of the pedestal and all of the silicon is removed from the back of the silicon-glass composite, the pedestal height is the same as the thickness of the remaining glass substrate. Unlike the process of U.S. Pat. No. 5,696,466, it is noted that the Si back-plane is removed in the process of the present invention.

The polished surfaces can then be provided with any desired metallization pattern using procedures known in the art. The smooth surface finish allows for fine line lithography to be produced. Further details of the proper use of the smooth surface finish of the planar glass wafer for fine line lithography can be found in U.S. patent application Ser. No. 08/610,825 to Chinoy, the disclosure of which is specifically incorporated by reference.

Where desired, solder bumps can be added to the metallization to assist with bonding. For example, an SnPb solder is compatible with the Cu on Ni metallization noted above, while an AuSn solder is compatible with the Pt on Au metallization.

Figure 2:
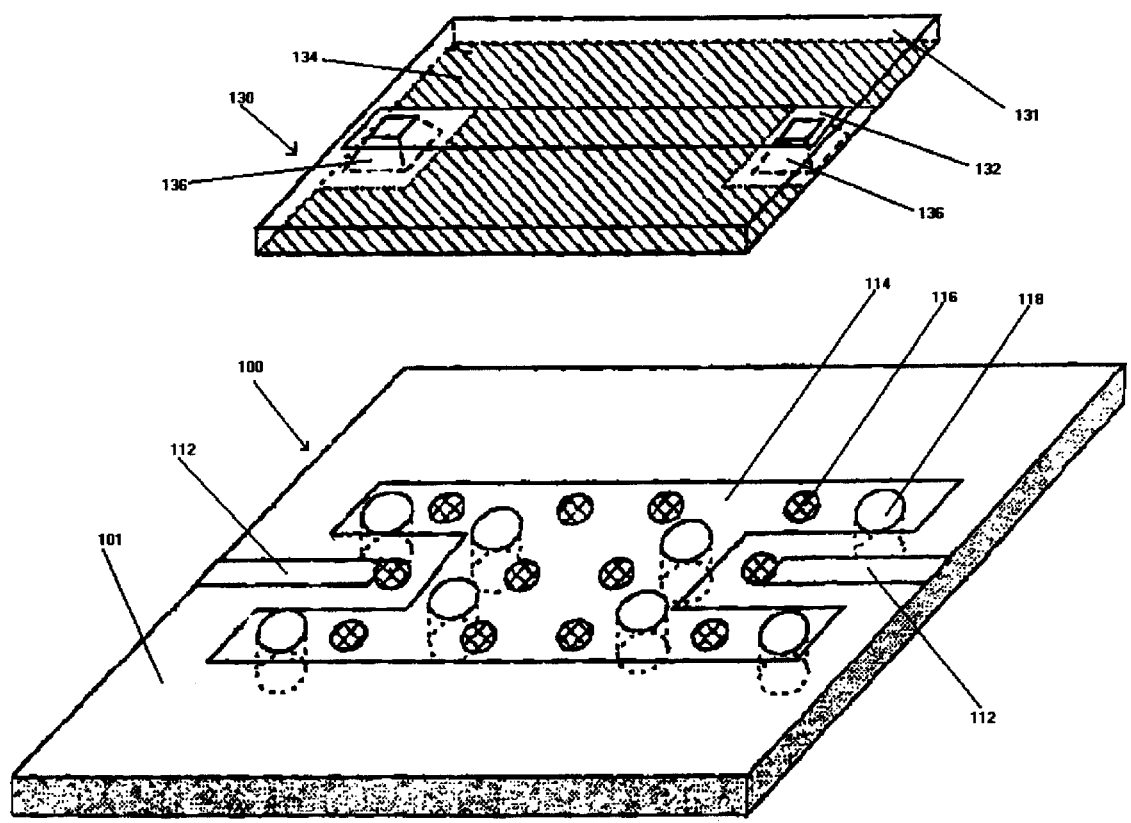
FIG. 2 illustrates an assembly in which a 50 $\Omega$ microstrip is transitioned from a motherboard to a carrier, according to an embodiment of the present invention.

FIG. 2 illustrates how a 50 □ microstrip can be transitioned from a motherboard to the carrier of the present invention, with minimal impedance losses. FIG. 2 shows a motherboard 100 which includes, for example, an FR-4 fiberglass substrate 101 provided with a pair of 50 □ microstrip transmission lines 112, a ground pad 114 and numerous solder ball bonding pads 116 and via holes to ground 118. A carrier 130 is also shown in FIG. 2 and includes a glass substrate 131 with an upper 50 □ microstrip transmission line 132 and an accompanying lower ground plane 134 (shown with cross-hatching). The carrier 130 includes is also provided with pedestals 136 consisting of, for example, an arsenic doped silicon core surrounded by a layer of silver. Bonding pads (not shown) are also provided on the ground plane 134 and pedestals 136 on the lower side of the carrier 130. The carrier 130 is ultimately connected to the motherboard 100 via solder balls (not shown).

Figure 3:
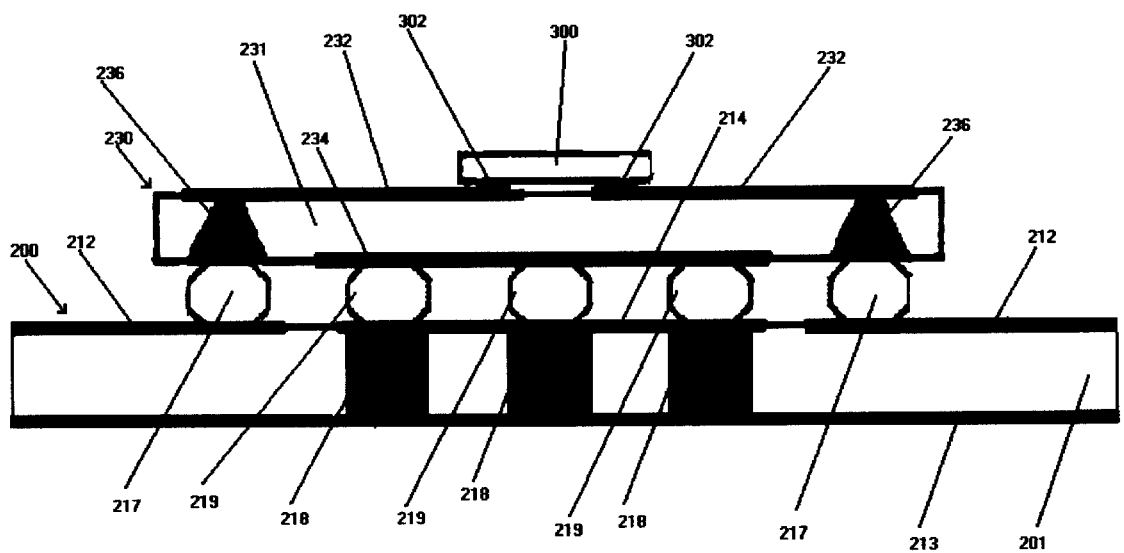
FIG. 3 illustrates an assembly in which a pHEMT device is mounted to a motherboard using a carrier in accordance with an embodiment of the present invention.

FIG. 3 illustrates an assembly in which a pHEMT device is mounted to a motherboard using a carrier in accordance with an embodiment of the present invention. The motherboard 200 of FIG. 3 is similar to that of FIG. 2. Illustrated is an FR-4 fiberglass substrate 201, which is provided with a ground pad 214 and ground vias 218. The motherboard also contains a pair of 50 □ microstrip transmission lines 212. The ground plane 213 for the microstrip transmission lines 212 is also shown. The carrier 230 of FIG. 3 is also similar to that of FIG. 2 in that it includes a glass substrate 231 and pedestals 236, which can consist of, for example an arsenic doped silicon core surrounded by a layer of silver. Instead of a single transmission line, the carrier 230 of FIG. 3 consists of a pair of upper 50 □ microstrip transmission lines 232 and an accompanying lower ground plane 234. The pedestals 236 are connected to transmission lines 212 via solder balls 217, and the ground pad 214 is connected to ground plane 234 via solder balls 219. A millimeter wave device 300, such as a pHEMT device 300, is flip-chip mounted to the transmission lines 232 on the top of carrier 200 via solder balls 302.

Although various embodiments are specifically illustrated and described herein, it will be appreciated that modifications and variations of the present invention are covered by the above teachings and are within the purview of the appended claims without departing from the spirit and intended scope of the invention.

What is claimed is:

1. A high frequency carrier comprising:
   a planar ceramic substrate having first and second faces, and
   at least one feed-through extending from said first face to said second face, which at least one feed-through comprises a pedestal of doped semiconductor that is at least partially surrounded by a conductive metal layer, wherein said doped semiconductor is silicon doped with arsenic.

2. The high frequency carrier of claim 1, wherein said silicon is doped with arsenic.

3. The high frequency carrier of claim 1, wherein said planar ceramic substrate is a glass substrate.

4. A high frequency carrier comprising:
   a planar ceramic substrate having first and second faces; and
   at least one feed-through extending from said first face to said second face, which at least one feed-through comprises a pedestal of doped semiconductor that is at least partially surrounded by a conductive metal layer, wherein the semiconductor is provided with sufficient doping to reduce its sensitivity to no greater than 0.02 Ω-cm.

5. The high frequency carrier of claim 4, wherein said semiconductor is silicon.

6. The high frequency carrier of clam 4, further comprising a metallization layer on at least one face of said planar ceramic substrate.

7. The high frequency carrier of claim 6, wherein said metallization layer comprises copper on nickel.

8. The high frequency carrier of claim 6, wherein said metallization layer comprises one or more signal paths.

9. The high frequency carrier of claim 8, wherein said one or more signal paths comprise a radio frequency transmission line.

10. The high frequency carrier of claim 6, further comprising one or more solder balls on said metallization, on said feed-throughs, or on both said metallization and said feed-throughs.

11. A high frequency carrier comprising:
    a planar ceramic substrate having first and second faces, and at least one feed-through extending from said first face to said second face, which at least one feed-through comprises a pedestal of doped semiconductor that is at least partially surrounded by a conductive metal layer, wherein said pedestal is in the form of a pyramidal section.

12. A high frequency carrier comprising:

a planar ceramic substrate having first and second faces; and at least one feed-through extending from said first face to said second face, which at least one feed-through comprises a pedestal of doped semiconductor that is at least partially surrounded by a conductive metal layer, wherein said pedestal is completely surrounded by metal.

13. A high frequency carrier comprising:

a planar ceramic substrate having first and second faces; and at least one feed-through extending from said first face to said second face, which at least one feed-through comprises a pedestal of doped semiconductor that is at least partially surrounded by a conductive metal layer, wherein said conductive metal is selected from silver, gold and copper.

14. A high frequency carrier comprising:

a planar ceramic substrate having first and second faces;

at least one feed-through extending from said first face to said second face, which at least one feed-through comprises a pedestal of doped semiconductor that is at least partially surrounded by a conductive metal layer; and a metallization layer on at least one face of said planar ceramic substrate, said metallization layer comprising a radio transmission line, wherein said transmission line is selected from microstrip line and coplanar line structure.

15. An electrical assembly comprising:

a high frequency carrier comprising:

a planar ceramic substrate having first and second faces: and at least one feed-through extending from said first face to said second face, which at least one feed-through comprises a pedestal of doped semiconductor that is at least partially surrounded by a conductive metal layer, wherein the first face of the carrier is attached to a metallized substrate, and wherein said at least one fee-through is electrically connected to said metallized substrate.

16. The electrical assembly of claim 15, further comprising:

at least one electronic element attached to said second face of said carrier, said electronic element selected from the group consisting of an electronic component and an electronic circuit wherein said at least one electronic element is electrically connected to at least one feed-through.

17. The electrical assembly of claim 16, wherein said at least one electronic element comprises an active device.

18. The electrical assembly of claim 17, wherein said active device is an electronic millimeter wave device selected from a field-effect transistor, high electron mobility transistor and a heterojunction bipolar transistor.

19. The electrical assembly of claim 16, wherein said metallized substrate is a printed circuit.

20. The electrical assembly of claim 16, wherein said metallized substrate is a metallized substrate comprising epoxy and fiberglass.

21. The electrical assembly of claim 16, wherein said metallized substrate is a metallized ceramic substrate.

22. The electrical assembly of claim 16, wherein metallization on said metallized substrate comprises one or more signal paths.

23. The electrical assembly of claim 20, wherein said one or more signal paths comprise a radio frequency transmission line.

24. The electrical assembly of claim 21, wherein said transmission line is selected from a microstrip line and a coplanar line structure.

25. The electrical assembly of claim 16, wherein said at least one electronic element is attached to said second face of said high frequency carrier by one or more solder balls.

26. The electrical assembly of claim 16, wherein said metallized substrate is attached to said high frequency carrier by one or more solder balls.

27. The electrical assembly of claim 16, wherein said semiconductor is silicon.

28. The electrical assembly of claim 16, wherein said ceramic substrate is a glass substrate.

29. The electrical assembly of claim 16, further comprising a metallization layer on at least one face of said ceramic substrate.

30. The electrical assembly of claim 29, wherein said metallization layer comprises one or more radio frequency transmission lines.

31. The electrical assembly of claim 15, wherein said metallized substrate is an MCM substrate and wherein said at least one electronic element comprises a semiconductor device.

* * * * *